United States Patent

Takahashi

[11] Patent Number: 5,841,965
[45] Date of Patent: Nov. 24, 1998

[54] SYSTEM AND METHOD FOR AUTOMATICALLY DETERMINING TEST POINT FOR DC PARAMETRIC TEST

[75] Inventor: Toshihiro Takahashi, Osaka, Japan

[73] Assignee: Ricoh Company, Ltd., Tokyo, Japan

[21] Appl. No.: 706,928

[22] Filed: Sep. 3, 1996

Related U.S. Application Data

[63] Continuation of Ser. No. 432,796, May 2, 1995, abandoned.

[30] Foreign Application Priority Data

May 16, 1994 [JP] Japan ................................ 6-100844

[51] Int. Cl.$^6$ ..................................................... G06F 11/27
[52] U.S. Cl. ............................. 395/183.09; 395/183.15; 371/22.5
[58] Field of Search ......................... 395/183.09, 183.15; 371/61, 62, 22.5, 22.6

[56] References Cited

U.S. PATENT DOCUMENTS

| | | | |
|---|---|---|---|
| 3,633,100 | 1/1972 | Heilweil et al. | 371/25.1 |
| 3,775,598 | 11/1973 | Chao et al. | 395/183.09 |
| 4,904,883 | 2/1990 | Iino et al. | 327/198 |
| 5,266,894 | 11/1993 | Takagi et al. | 324/765 |
| 5,282,213 | 1/1994 | Leigh et al. | 371/22.1 |

*Primary Examiner*—Robert W. Beausoliel, Jr.
*Assistant Examiner*—Pierre E. Elisca
*Attorney, Agent, or Firm*—Cooper & Dunham LLP

[57] ABSTRACT

Logical simulation result data is obtained from performing a logical simulation operation on a logical circuit to be tested. The logical simulation result data is then examined and thus a test point is obtained for a DC parametric test in which direct-current characteristics of the logical circuit are tested. The logical simulation result data indicates input logical signal levels applied to input terminals and output logical signal levels appearing at output terminals in response to application of the input logical signal levels to the input terminals, and further indicates how the input logical signal levels and output logical signal levels vary as time progresses. It is determined whether or not a desired logical signal level is held at a predetermined circuit terminal of the input terminals and output terminals for a predetermined level maintenance time period in the logical simulation result data.

9 Claims, 4 Drawing Sheets

SYSTEM AND METHOD FOR AUTOMATICALLY DETERMINING TEST POINT FOR DC PARAMETRIC TEST

This is a continuation of application Ser. No. 08/432,796 filed May 2, 1995, now abandoned.

BACKGROUND OF THE INVENTION

Field of the Invention

The present invention relates to a system and a method for automatically determining a test point for a DC parametric test. The DC parametric test is one of performance tests which are performed on digital LSI circuits before shipment thereof. These performance tests are performed in order to determine whether or not the digital LSI circuits exhibit normal performance characteristics.

This can be determined as a result of examining how the LSI circuits output signals from output terminals thereof in response to inputting of signals into input terminals thereof. A functional test is another one of the performance tests. The functional test examines, as time progresses, a variation between a logical signal level of two logical signal levels high/low (1/0) on each of the output terminals in response to a variation of logical signal levels input into the input terminals. For performing this functional test, a test pattern and logical simulation result data are used. A test pattern is many series of input/output logical signal level values, each series indicating variations in logical signal level values as time progresses at a respective one of the input terminals, output terminals, and bi-directional terminals. The test pattern indicates a logical signal level applied to each input terminal and also indicates a logical signal level expected at each output terminal in response to the application of the logical signal value to each input terminal.

For the functional test, a test cycle, being a time period, is previously determined. Logical signal level values constituting the test pattern are determined for every test cycle. A timing at which a respective logical signal level value is determined in each test cycle will be referred to as a strobe, hereinafter. Each one of the thus-determined logical signal level values will be referred to as a typical level value for a test cycle, hereinafter. Thus, each series of input/expected output logical signal level values of the test pattern consists of a series of typical level values indicating discrete signal level variation.

A logical simulation is performed using a circuit diagram represented on a computer program and such a test pattern, and is performed before actual LSI circuit designing is performed. The logical simulation is performed in order to obtain data indicating how a circuit represented on the circuit diagram operates using the test pattern. The thus-obtained data is the logical simulation result data. This data indicates continuous signal level variations for each one of the input terminals, output terminals and bi-directional terminals of the circuit. The test pattern indicates a single typical level value of a signal level for a strobe of each test cycle for each circuit terminal. However, the logical simulation result data indicates even a continuous signal level variation as time progresses in each test cycle.

The DC parametric test is a test for measuring, for example, an actual voltage value, as an appropriate one of a logical L or H level, appearing at an appropriate output terminal in response to application of a certain voltage, as an appropriate one of the logical L or H level, to an appropriate input terminal. Then, it is confirmed whether the thus-measured actual voltage has a level within predetermined allowable limits. A test as another example of the DC parametric test is a test for measuring an actual electric current flowing out from an appropriate input/output terminal in response to application of a certain voltage, as an appropriate one of the logical L or H level, to the same circuit terminal. Then, it is confirmed whether the thus-measured actual electric current has a value within predetermined allowable limits. Such a voltage value/electric current value is measured during a predetermined series of functional operations performed by an LSI circuit. Such a value is measured at a predetermined timing at which the predetermined series of functional operations is stopped. Thus, the voltages/electric current in steady state is measured. Thus, the DC parametric test measures an absolute input/output value in a circuit while the functional test examines a logical operation sequence of the circuit.

During actual functional operations, a state, for example, a logical signal level at each of input/output/bi-directional terminals, of an LSI circuit varies along time progression. It is preferable to measure absolute values of voltages/electric currents at input/output/bi-directional terminals at such a state of the LSI circuit which actually appears during such actual functional operations so as to test a practical performance of the LSI circuit. For this purpose, these voltage values/electric current values are measured during a predetermined series of functional operations performed by an LSI circuit, and are measured at the predetermined timings when the predetermined series of functional operations being performed is stopped, as mentioned above. The predetermined series of functional operations should be one which is equivalent, in view of the purpose of the DC parametric test, to the actual functional operations which the LSI circuit will actually perform while it is being used by a user.

One item, for example, of the DC parametric test is a "$Vo_H$" test in which an absolute voltage value is measured at an output terminal of an LSI circuit being tested when the output terminal is at the logical H (high) level.

As mentioned above, the DC parametric test measures an actual voltage/electric current value, when a predetermined series of functional operations is stopped at a predetermined timing while the predetermined series of functional operations is being performed on an LSI circuit being tested. The above-mentioned predetermined timing is referred to as the test point. Thus, the above-mentioned $Vo_H$ test is performed at a relevant one of the test points.

RELATED ART

The predetermined series of functional operations is preferably the actual functional operations as mentioned above. However, alternatively, it is also possible that an engineer produces a special test pattern corresponding to a series of functional operations which is significantly equivalent to the actual functional operations in view of the purpose of the DC parametric test. For the engineer to produce such a special test pattern, the engineer must determine suitable ones of the above test points within the special test pattern. In cases in which gate arrays are tested, such special test patterns are used. However, for producing such a special test pattern for the DC parametric test, a work load of the engineer to produce it is increased.

When the predetermined series of functional operations used in the DC parametric test is the actual functional operation, the test pattern corresponding to the actual functional operations is used. This test pattern is that which was originally produced for the logical simulation. Therefore, it is not necessary to produce a special test pattern for the DC parametric test. However, it is necessary to search all the test cycles of the test pattern for a test cycle suitable as the above-mentioned test point.

Specifically, in order to obtain such a test point for the above-mentioned $Vo_H$ test from a test pattern of the actual functional operation, test cycles are searched for from among all the test cycles of the test pattern, at each of which cycles a signal level at a relevant circuit terminal is at the logical H level. Such a searching operation is a simple one and thus may be automatically performed. However, it is necessary to further examine whether or not a time period for which the logical H level is maintained in each of the thus-searched test cycles is so long that an absolute voltage may be surely measured. Because the test pattern only includes a discrete typical level value at a circuit terminal for each test cycle, how long the logical H level is maintained cannot be examined from the test pattern.

A problem which may occur when the test point of the logical H level is determined without examining a time period for which the logical H level is maintained will now be described with reference to FIG. 1. FIG. 1 shows an output signal level waveform at a circuit terminal of a circuit at three test cycles, CYCLE 1, CYCLE 2, and CYCLE 3 as a part of logical simulation result data. Arrows shown in the figure indicate strobes such as the strobe mentioned above for determining a typical level value. As shown in the figure, the signal level is at the logical H level during the test cycle CYCLE 2 at least at the strobe therein. Therefore, when the test pattern corresponding to the logical simulation result data including the signal variation shown in FIG. 1, the test cycle CYCLE 2 is determined as the test point which can be used for the $Vo_H$ test. Because the test pattern only indicates discrete typical level values, even if a time period for which the logical H level is maintained is short, a test cycle including the logical H level is determined as the test point as long as the logical H level appears at the strobe of the test cycle.

However, if the time period for which the logical H level is maintained is short in the logical simulation result data, although the predetermined series of functional operations is stopped at the test point, the signal level may decay to the logical L (low) level soon. Therefore, when measuring of an actual voltage level at the relevant circuit terminal is started, as the $Vo_H$ test, after the predetermined series of functional operations is stopped, the voltage level at the circuit terminal may decay to the logical L (low) level while the signal level is being measured, and thus it may not be possible to surely measure an absolute value of the logical H level.

Ordinarily, when such a DC parametric test is performed, a timing at which the predetermined series of functional operations can be stopped is the end time of each test cycle. Therefore, in the above-mentioned example shown in FIG. 1, the voltage level is at the logical L level at the end time of that test cycle. As a result, the $Vo_H$ cannot be performed using this test point.

SUMMARY OF THE INVENTION

An object of the present invention is to eliminate the above-mentioned problems. According to the present invention, it is not necessary to produce a special test pattern for the DC parametric test. Further, the test point suitable for the DC parametric test can be automatically determined, and an actual voltage/electric current value measurement can be surely performed at the thus-determined test point.

In order to achieve this object of the present invention, according to the present invention, the test point is determined not from the special test pattern but from logical simulation result data on the actual functional operation. The logical simulation result data is data resulting from a logical simulation of the actual functional operations using a circuit for an LSI circuit represented on a computer program. When, for example, a test point for a $Vo_H$ test is obtained using the logical simulation result data, test cycles are searched for from among all the test cycles of the logical simulation result data, at each of which cycles a signal level at a relevant circuit terminal is at the logical H level. Further, it is also possible, by using the logical simulation result data, to examine whether or not a time period for which the logical H level is maintained in each of the thus-searched test cycles is so long that an absolute voltage may be surely measured.

Other objects and further features of the present invention will become more apparent from the following detailed description when read in conjunction with the accompanying drawings.

DESCRIPTION OF PREFERRED EMBODIMENTS

A system for automatically determining a test point for a DC parametric test in an embodiment of the present invention will now be described with reference to the accompanying drawings. The description for the above-mentioned system also describes a method for automatically determining a test point for the DC parametric test in an embodiment of the present invention.

Figure 1:
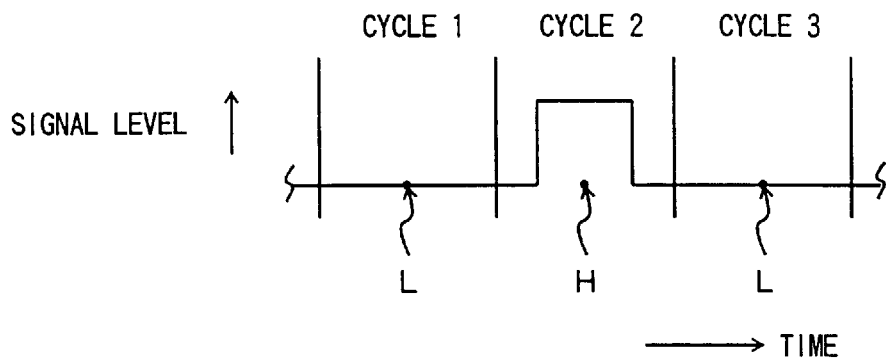
FIG. 1 shows a waveform of a series signal levels for illustrating a method for searching for a test point in the related art.
Figure 2:
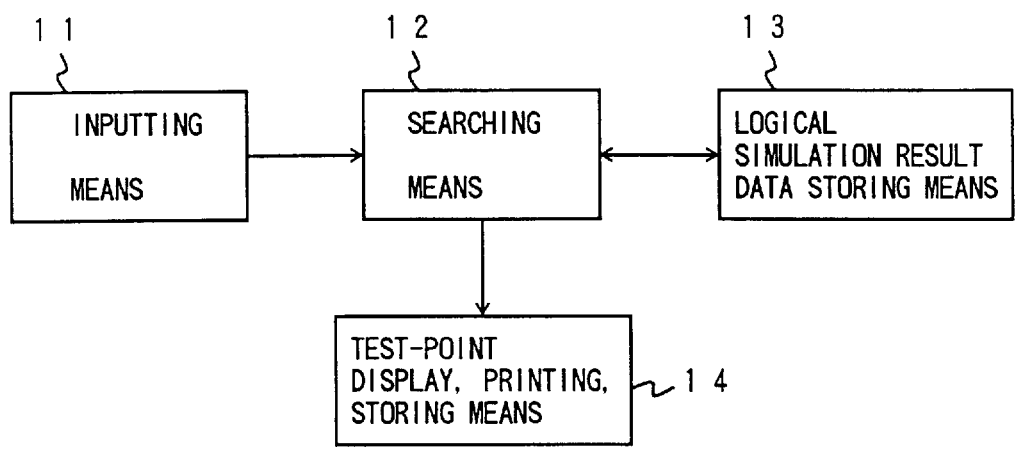
FIG. 2 shows a block diagram of a system for automatically determining a test point for a DC parametric test in an embodiment of the present invention.

The system for automatically determining a test point includes, as shown in FIG. 2, inputting means 11, searching means 12 electrically connected to an output side of the inputting means 11, storing means 13 electrically, bi-directionally connected with the searching means 12, and test-point display, printing and storing means 14 electrically connected to an output side of the searching means 12.

The inputting means 11 consists of a keyboard or a mouse, and is used by an operator to input various sorts of information, the thus-inputted information being then supplied to the searching means 12. The thus-input various sorts of information specify conditions to be fulfilled by the test point which will be used for the DC parametric test. The above-mentioned various sorts of information includes an actual time period, for example, "100 nanoseconds", of a test cycle; a required logical signal level to be used in the DC parametric test, for example, the "H"level when the above-described $Vo_H$ test is performed; a minimum level-maintenance time period, for example, "100 nanoseconds", for which the above-mentioned required logical signal level is maintained for surely measuring an absolute value of the logical signal level, and so forth.

Further, other sorts of information are supplied to the searching means 12 through the inputting means 11. The other sorts of information will now be described. A sort of information of these sorts of information is information indicating a sampling timing at which a typical logical signal value is sampled from each test cycle. Normally, this sampling timing is determined as being in coincidence with the end time of each test cycle, for example, a time $E_3$ for a test cycle CYCLE 3 shown in FIG. 4. However, it is also possible to determine the sampling timing as being in coincidence with any middle time in each test cycle, for example, the above-mentioned strobe, for example, $M_1$ for a test cycle CYCLE 1, $M_2$ for a test cycle CYCLE 2, $M_3$ for the test cycle CYCLE 3. This is because, by a certain reason, it is requested to obtain a logical signal value at such a middle time from each test cycle. For example, there is a case where operating cycles of the LSI circuit are not the same as the test cycles of an LSI circuit testing apparatus. (The LSI circuit testing apparatus is an apparatus to be used for testing LSI circuits and is referred to as an Automatic Test Equipment, abbreviated ATE.) In such a case, it may be requested to obtain a logical signal value at the end time of a cycle of the operating cycles, which end time corresponds to a middle time in a test cycle of the LSI circuit testing apparatus. In order to obtain a logical signal value at the end time of a cycle of the operating cycles, it is requested to determine the above-mentioned sampling timing as being the middle time, such as $M_3$ for the test cycle CYCLE 3 shown in FIG. 4, instead of the end time, such as $E_3$ therefor.

Another sort of information is information indicating a setting-up time period, for example, "50 nanoseconds", for which the above-mentioned desired logical signal level is maintained before the above-mentioned sampling timing. Another sort of information is information indicating a holding time period, for example, "50 nanoseconds", for which the above-mentioned desired logical signal level is maintained after the sampling timing.

The actual DC parametric test is performed by stopping the predetermined series of functional operations of the LSI circuit and the time at which the predetermined series of functional operations of the LSI circuit can be stopped is the end time of the test cycle. Then, after the stopping, the actual voltage/electric current is measured on the LSI circuit. Therefore, if the above-mentioned sampling timing is not in coincident with the end time but a middle time of the test cycle as mentioned above as shown in FIG. 4, it is necessary to determine the above-mentioned holding time period so long that the desired logical signal level is maintained after the sampling timing and then is maintained for a certain time period after the subsequent end of the test cycle at which the predetermined series of functional operations of the LSI circuit is actually stopped. The above-mentioned certain time period is a time period within which the actual voltage/electric current measurement can be surely performed.

Further, as information being inputted by the operator through the inputting means 11, information indicating excepting test cycles for which determination of the test point is prevented may be supplied to the searching means 12. For example, generally speaking, an initialization operation is performed for the first several test cycles in the logical simulation result data. Such an operation may not be an essential operation in the entire sequence of the logical simulation. The test point is preferably determined as a test cycle which is included in test cycles for which the essential operation is performed. Therefore, the above-mentioned first several test cycles preferably may be excepted from being used for searching for the test point. For this purpose, information indicating excepting test cycles may be supplied to the searching means 12.

Furthermore, there may be a case where it is essential that a logical signal level at a certain circuit terminal should be at a certain level when the measurement of voltage/electric current is performed on a certain circuit terminal. In such a case, information indicating such a certain logical signal level at a certain circuit terminal may be supplied to the searching means.

An example for such a case will now be described. An Iccs test is another test item in the DC parametric test. This Iccs test is a test for measuring a leakage electric current which flows from a certain circuit terminal to the ground. However, there is a case where the certain circuit terminal is pulled up, that is, is connected to a positive power source via a pulling-up resistance or the like for a purpose of letting an unexpected, undesirable surge current flow to the power source, thus preventing the surge current from flowing through a logic circuit, or the like. In such a case, if a leakage current is measured when the certain circuit terminal is at the L level, a significant electric potential appears between the circuit terminal and the power source and thus an electric current flows through the pulling-up resistance to the power source accordingly. Thus, no meaningful Iccs test can be performed. In order to eliminate such a problem, it is necessary to find a test point for the Iccs test at which the logical H level is applied to the certain circuit terminal.

Similarly, if a certain circuit terminal on which the Iccs test is performed is pulled down, that is, the certain circuit terminal is connected to the ground via a pulling-down resistance, it is necessary to use the test point at which the logical L level is applied to the certain circuit terminal.

Thus, information indicating such a certain logical signal level at a certain circuit terminal may be supplied to the searching means if necessary for the Iccs test.

The storing means 13 stores logical simulation result data such as that described above obtained as a result of a logical simulation being performed on a logical circuit to be tested.

The searching means 12 search the logical simulation result data supplied by the storing means 13 for the test point described above, which test point fulfills conditions specified by the various sorts of information mentioned above, input through the inputting means 11. Details of a searching operation performed by the searching means 12 will be described later.

The test-point display, printing and storing means 14 stores, visibly displays, and prints out information indicating the test point resulting from the above-mentioned searching. The test-point display, printing and storing means 14 is not limited to means which can perform all the functions of display, printing and storing functions. It is also possible in the present invention to provide such means which performs at least one of the above-mentioned functions.

Figure 3:
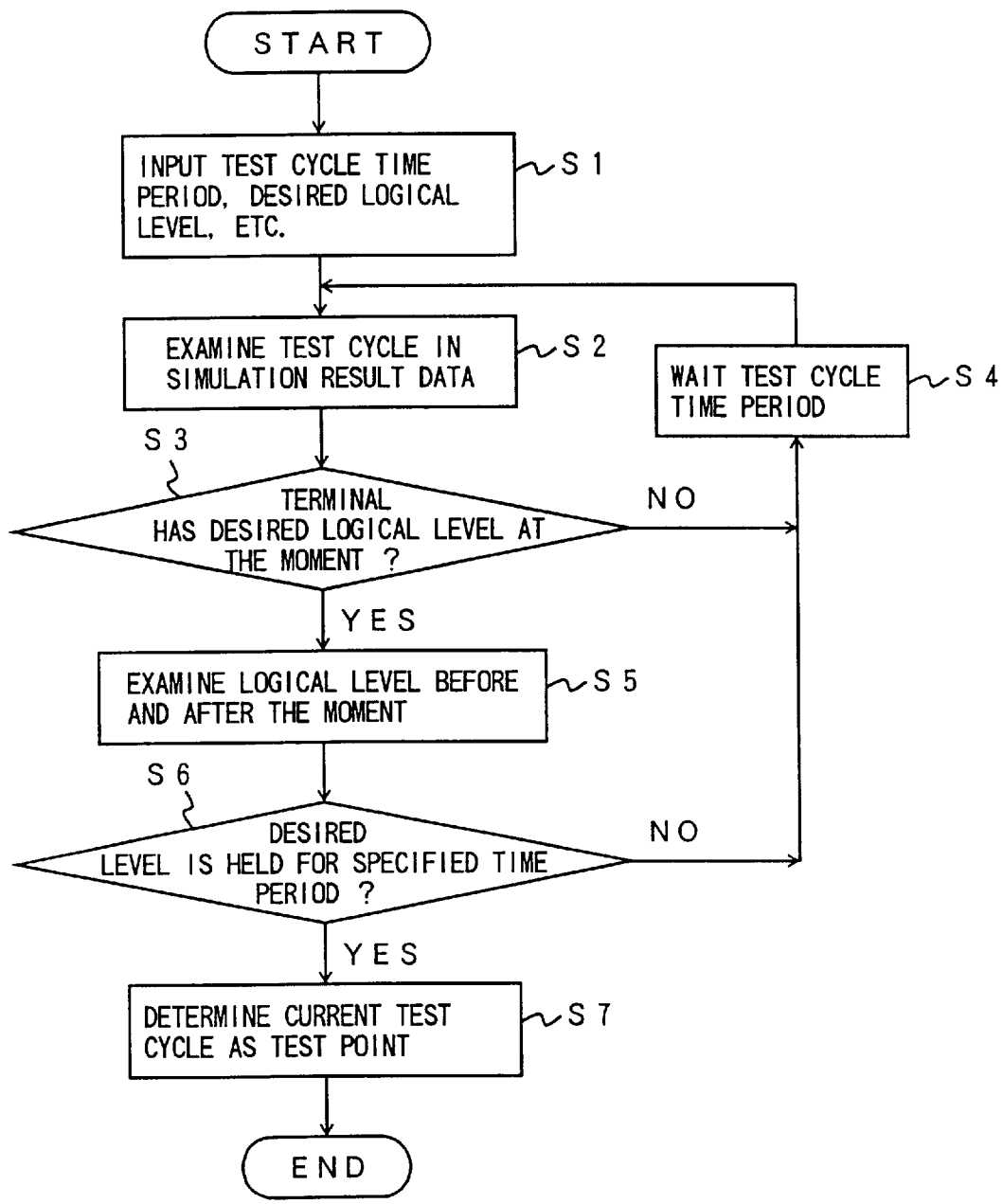
FIG. 3 shows an operation flow in the system shown in FIG. 2 of a method for automatically determining the test point for the DC parametric test in an embodiment of the present invention.

How the system for automatically determining a test point in the embodiment of the present invention having the above-described structure operates will now be described with reference to an operation flow chart shown in FIG. 3 and an example of a signal level waveform shown in FIG. 4. We use an example of an operation performed to find the test point to be used in the above-mentioned "$Vo_H$" test.

Therefore, the system searches for the test point at which a signal at an output terminal has the logical H level together with necessary ones of the above-mentioned conditions specified by the various sorts of information.

In a step S1 (a term "step" will be omitted, hereinafter) shown in FIG. 3, an operator inputs the various sorts of information such as a time period of the test cycle, a desired logical signal level (the "H" level being input, here), and a minimum maintenance time period (Ts) to the system through the inputting means 11.

In S2, the searching means 12 examines a first test cycle, included in the logical simulation result data, excepting several test cycles if the several test cycles were specified by information indicating excepting test cycles such as described above previously input through the inputting means 11. Specifically, the searching means focuses a desired moment during the above-mentioned test cycle as a candidate of the test point to be finally obtained. Which desired moment during a test cycle which is focused as the candidate was previously input through inputting means 11 as the above-mentioned sampling timing. The sampling timing may be arbitrarily determined, for example, may be a middle timing of as mentioned above or, ordinarily may be the end of the test cycle. In the example shown in FIG. 4, the sampling timings are determined, for example, as shown by the reference numerals $M_1$, $M_2$, $M_3$ and $M_4$, each being a middle timing in a respective test cycle of the test cycles CYCLE 1, CYCLE 2, CYCLE 3 and CYCLE 4.

In S3, the searching means 12 determines whether or not a signal level at the circuit terminal of the circuit is the above-mentioned desired logical value, that is, the H level at the above-mentioned sampling timing for each test cycle starting from the above-mentioned first test cycle. Specifically, in the example of the waveform shown in FIG. 4, the moment $M_1$ in the CYCLE 1 is first examined. Because the signal level is L during the CYCLE 1 as shown in the figure, the result of S3 is NO, and thus S4 is then performed.

S4, in order to specify a test cycle, subsequent to the current test cycle examined in S3, to be subsequently examined, waits a time corresponding to the above-mentioned time period of the test cycle after the sampling timing in the current test cycle. Thus, a time corresponding to the sampling timing in the subsequent test cycle is obtained and the searching means 12 then examines the thus-obtained sampling timing in the subsequent test cycle in S2. That is, in the example shown in FIG. 4, the test cycle CYCLE 2 is examined. The signal level is the H level at the moment $M_2$ in the cycle CYCLE 2 as shown in the figure. Therefore, the result of S3 is YES and thus S5 is then performed.

S5 and S6 examine whether or not this H level is held for the above-mentioned minimum maintenance time period Ts which was input through the inputting means 11 as mentioned above. Further to and independent of or instead of the examining of the level holding time in view of the minimum maintenance time period Ts, it is also possible to examine the level holding time in view of the above-mentioned setting-up time period which is a level holding time before the sampling timing and holding time period which is a level holding time after the sampling timing.

Figure 4:
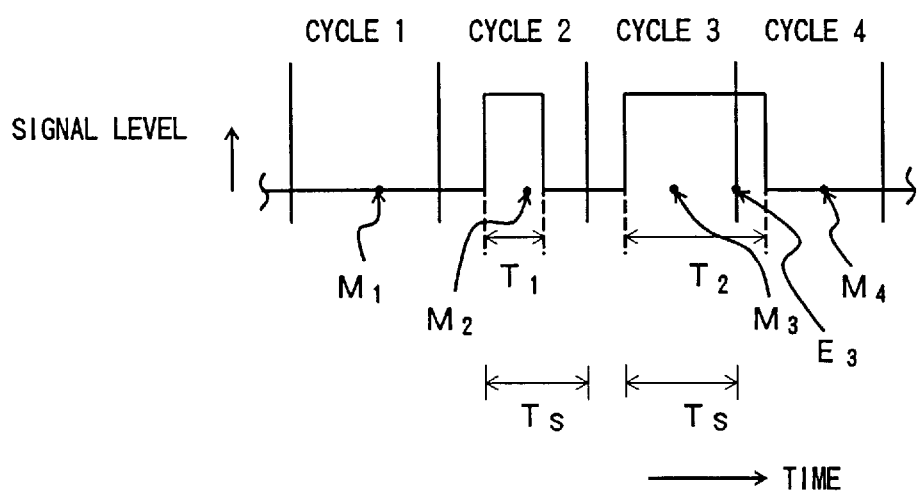
FIG. 4 shows a waveform of a series of signal levels for illustrating the operation flow shown in FIG. 3.

In the example shown in FIG. 4, the H level holding time period $T_1$ including the moment $M_2$ is shorter than the predetermined minimum maintenance time period Ts as shown in the figure. Therefore, the result of S6 is NO and thus S4 is then performed. Thus, the searching means 12 will then examine the moment $M_3$ in the CYCLE 3 shown in FIG. 4. Thus, the searching means performs S2, S3, S4, S5 and S6. The H level holding time period $T_2$ including the moment $M_3$ is longer than the predetermined minimum maintenance time period Ts as shown in the figure, and thus the result of S6 is YES. Therefore, S7 is then performed.

S7 determines that the CYCLE 3 is the test point for the $Vo_H$ test. Then, information indicating the thus-determined CYCLE 3 is sent to the test-point display, printing, storing means 14 which then displays, prints put and stores the thus-sent information appropriately.

However, in the example shown in FIG. 4, the sampling timing is the middle time in each test cycle. Therefore, as mentioned above, it is necessary to examine whether or not the holding time after the sampling timing is so long that the desired logical signal level is maintained after the sampling time to the subsequent end time of the test cycle and then is maintained for a certain time period even after the subsequent end time of the test cycle. At the subsequent end time of the test cycle, the predetermined series of functional operations of the LSI circuit is actually stopped. The above-mentioned certain time period is a time period within which the actual voltage/electric current measurement can be surely performed after the stopping of the predetermined series of functional operations.

The thus-stored information may be directly used as data for a test program which will operate the LSI circuit testing apparatus. This LSI circuit testing apparatus actually tests an LSI circuit as mentioned above, which circuit, in a form of a software program, has undergone the logical simulation. The logical simulation result data obtained as a result of the logical simulation is then used to obtain the test point for the DC parametric test as described above, for example, with reference to FIG. 3. The above-mentioned LSI circuit testing apparatus will actually perform the DC parametric test using the thus-obtained test point.

Specifically, first, the predetermined series of functional operations corresponding to the logical simulation result data is actually performed on an actual LSI circuit having the relevant logical circuit therein. Then, the predetermined series of functional operations is stopped at the relevant test point. Then, the $Vo_H$ test is performed on the relevant circuit terminal of the LSI circuit. That is, an actual voltage, as the logical H level, at the circuit terminal is measured and it is confirmed whether a value of the thus-measured actual voltage is within predetermined allowable limits. It was confirmed, in the system and method for automatically determining a test point for the DC parametric test in the embodiment of the present invention, that the logical H level was maintained for the period $T_2$ longer than the predetermined minimum level maintenance time period Ts at the relevant circuit terminal from the logical simulation result data. Therefore, it is possible to surely measure the actual voltage at the circuit terminal during the $Vo_H$ test.

Thus, according to either the system or the method for automatically determining a test point for the DC parametric test according to the present invention, the test point suitable for the DC parametric test can be automatically obtained using the logical simulation result data. As a result, an engineer may be free from troublesome works to obtain the test points. Thus, a time period required for the entire time period of an LSI circuit designing and testing work can be shortened and also it is possible to improve efficiency and quality of the LSI circuit designing and testing work.

Further, it is possible to input various sorts of information such as that indicating an sampling timing in each test cycle, a time period of the test cycle, a setting-up time period, a holding time period, excepting test cycles, and "a certain logical signal level at a certain circuit terminal" such as those mentioned above as described above. Therefore, it is possible to determine the test point which fulfills the engineer's detailed requests.

Figure 5:
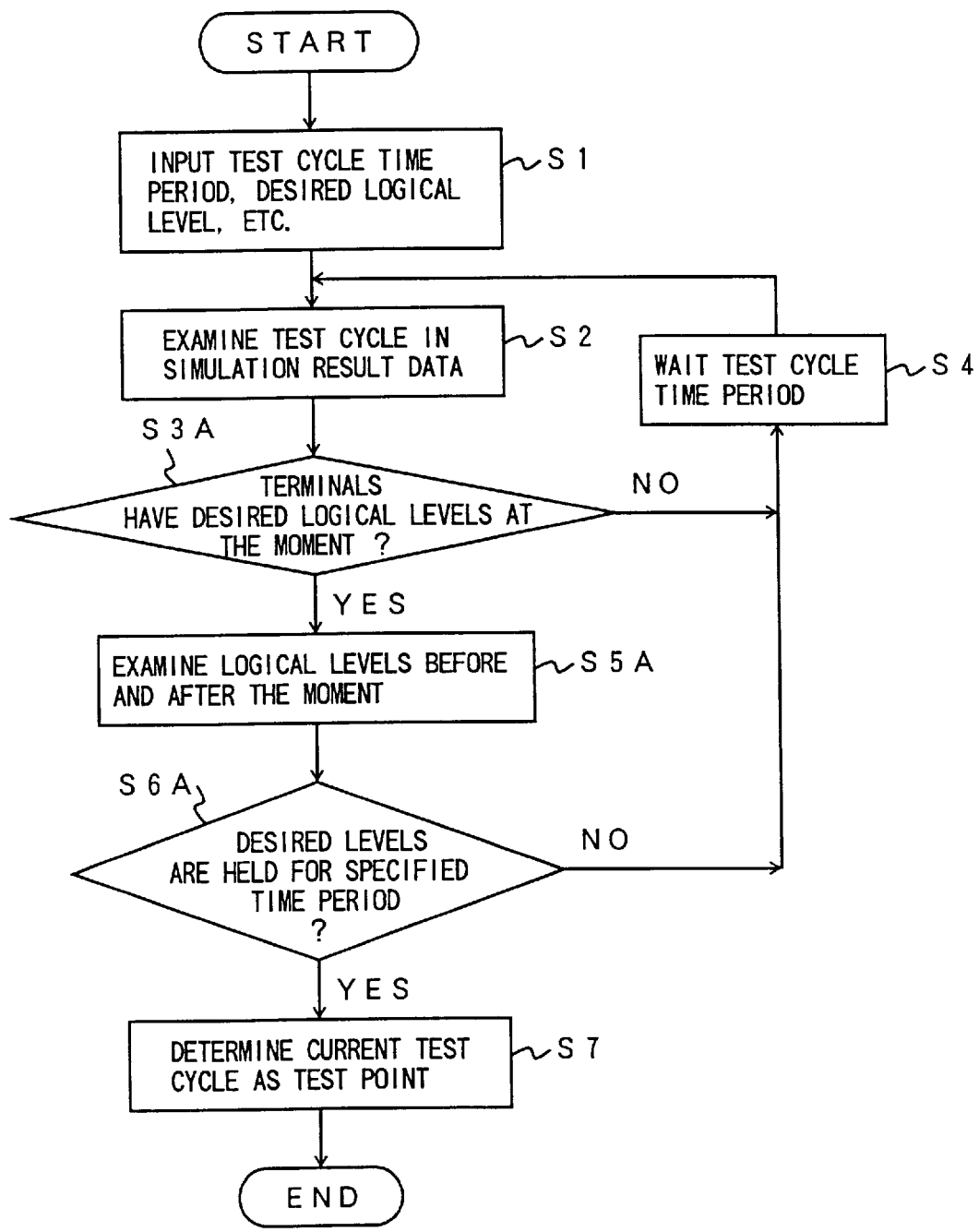
FIG. 5 shows another operation flow in the system shown in FIG. 2 of a method for automatically determining the test point for the DC parametric test in an embodiment of the present invention.

There may be a case where the test point for the above-described Iccs test item is determined according to the system or method of the present invention. FIG. 5 shows an operation flow for such a case and the operation flow shown in FIG. 5 is similar to that shown in FIG. 3. The same step numbers, as those shown in FIG. 3, are given to substantially the same steps as those shown in FIG. 3. How the system in the above-described embodiment of the present invention operates and how the method in the above-described embodiment of the present invention performs for the above-mentioned case will now be described in view of only points at which the operation flow shown in FIG. 5 is different from that shown in FIG. 3.

In the above-mentioned case, in S3A instead of S3, not only a logical signal level at a relevant circuit terminal of a logical circuit but also a logical signal level at a certain circuit terminal of the logical circuit is examined. Then, in S5A and S6A instead of S5 and S6, whether or not the logical signal level at the relevant circuit terminal of the logical circuit and also the logical signal level at the certain circuit terminal of the logical circuit are held for the predetermined minimum level maintenance time period Ts is examined.

The above-mentioned certain circuit terminal is a circuit terminal, a logical signal level of which affects a direct-current value at the predetermined circuit terminal. For example, the certain circuit terminal is a circuit terminal which is pulled up or pulled down as mentioned above. Thus, it is necessary that a certain logical signal level be maintained at the certain circuit terminal when the Iccs test is performed on the predetermined circuit terminal. Thus, the meaningful Iccs test can be performed.

Further, the present invention is not limited to the above-described embodiments, and variations and modifications may be made without departing from the scope of the present invention.

What is claimed is:

1. A system for automatically determining a test point for a DC parametric test, comprising:

means for supplying logical simulation result data which is obtained from performing a logical simulation operation on a logical circuit to be tested;

examining means for examining said logical simulation result data for determining specific points in the logical simulation result data which provide specific output signal characteristics, the points being used as test points for said DC parametric test in which direct-current characteristics of said logical circuit are tested.

2. The system according to claim 1, wherein:

said logical simulation result data indicates input logical signal levels applied to input terminals and output logical signal levels appearing at output terminals in response to application of said input logical signal levels to said input terminals, and further indicates how said input logical signal levels and output logical signal levels vary as time progresses; and said examining means determines whether or not a desired logical signal level is held at a predetermined circuit terminal of said input terminals and output terminals for a predetermined level maintenance time period in said logical simulation result data.

3. The system according to claim 2, wherein:

said examining means sets a repetitive predetermined time period on said logical simulation result data; and said examining means examines said logical simulation result data for each said predetermined time period.

4. The system according to claim 3, wherein:

said examining means examines a logical signal level in said logical simulation result data at a desired moment during each predetermined time period to determine whether or not said logical signal level is the same as said desired logical signal level; and said examining means, if said logical level is the same as said desired logical signal level, determines whether or not said desired logical signal level is held for a predetermined setting-up time period before said desired moment and determines whether or not said desired logical signal level is held for a predetermined holding time period after said desired moment.

5. The system according to claim 2, wherein said examining means examines a logical signal level in said logical simulation result data, only for a part of said logical simulation result data other than a part previously specified to be excepted from being subject to the examination.

6. The system according to claim 2, wherein said examining means examines not only a logical signal level at a predetermined circuit terminal in said logical simulation result data, a direct-current value at said predetermined circuit terminal being directly measured in said DC parametric test, but also a logical signal level at a certain circuit terminal, said direct-current value at said predetermined circuit terminal depending on said logical signal level at said certain circuit terminal.

7. A method for automatically determining a test point for a DC parametric test, comprising steps of:

a) supplying logical simulation result data which is obtained from performing a logical simulation operation on a logical circuit to be tested;

b) examining said logical simulation result data to determine specific points in the logical simulation result data which provide specific output signal characteristics, the points being used as test points for said DC parametric test in which direct-current characteristics of said logical circuit are tested.

8. The method according to claim 7, wherein:

said logical simulation result data indicates input logical signal levels applied to input terminals and output logical signal levels appearing at output terminals in response to application of said input logical signal levels to said input terminals, and further indicates how said input logical signal levels and output logical signal levels vary as time progresses; and said step b) determines whether or not a desired logical signal level is held at a predetermined circuit terminal of said input terminals and output terminals for a predetermined level maintenance time period in said logical simulation result data.

9. A system for automatically determining a test point for a DC parametric test, comprising:

means for supplying logical simulation result data which is obtained from performing a logical simulation operation on a circuit diagram represented by computer program;

examining means for examining said logical simulation result data for determining specific points in the logical simulation result data which provide specific output signal characteristics, the points being used as test points for said DC parametric test in which direct-current characteristics of said logical circuit are tested.

* * * * *